United States Patent
Koyanagi et al.

(10) Patent No.: US 9,669,980 B2
(45) Date of Patent: Jun. 6, 2017

(54) FEEDER MANAGEMENT SYSTEM OF COMPONENT MOUNTING APPARATUS

(75) Inventors: Yuji Koyanagi, Chiryu-shi (JP); Yukinori Takada, Chiryu-shi (JP)

(73) Assignee: FUJI MACHINE MFG. CO., LTD., Chiryu-shi (JP)

(*) Notice: Subject to any disclaimer, the term of this patent is extended or adjusted under 35 U.S.C. 154(b) by 134 days.

(21) Appl. No.: 14/380,568

(22) PCT Filed: Mar. 13, 2012

(86) PCT No.: PCT/JP2012/056400
§ 371 (c)(1),
(2), (4) Date: Aug. 22, 2014

(87) PCT Pub. No.: WO2013/136440
PCT Pub. Date: Sep. 19, 2013

(65) Prior Publication Data
US 2015/0034714 A1  Feb. 5, 2015

(51) Int. Cl.
*H05K 3/30* (2006.01)
*H05K 13/04* (2006.01)
(Continued)

(52) U.S. Cl.
CPC ............ *B65D 75/327* (2013.01); *G06K 7/10* (2013.01); *H05K 3/30* (2013.01); *H05K 3/301* (2013.01);
(Continued)

(58) Field of Classification Search
CPC ............ H05K 13/0452; H05K 13/046; H05K 13/0486; H05K 13/022; H05K 13/0417; H05K 3/301; H05K 3/30
See application file for complete search history.

(56) References Cited

U.S. PATENT DOCUMENTS 4,324,034 A * 4/1982 Berry et al. .................. 29/410
4,610,083 A * 9/1986 Campisi ............ H05K 13/0417
156/751
(Continued)

FOREIGN PATENT DOCUMENTS

GB  2 298 085 A  8/1996
JP  11-135986 A  5/1999
(Continued)

OTHER PUBLICATIONS

U.S. Appl. No. 14/384,305, filed Sep. 10, 2014, Noda.
(Continued)

*Primary Examiner* — Daniel Walsh
(74) *Attorney, Agent, or Firm* — Oblon, McClelland, Maier & Neustadt, L.L.P.

(57) ABSTRACT

A tape feeder is configured such that plural tape suppliers guiding plural component supply tapes to a component pick-up position are individually and detachably mounted on plural slots of the feeder body. A read component ID from a code label of a tape reel is input into a feeder management computer. The feeder management computer performs instruction display of the slot to be mounted among the plural slots to an instruction display section based on component ID. If a mounting confirmation sensor confirms the tape supplier is mounted on one of the slots, the feeder management computer determines whether or not a component in which the component ID is read is supplied from a correct slot depending on whether or not the slot in which the mounting of the tape supplier is confirmed matches the slot in which the instruction display is performed.

12 Claims, 11 Drawing Sheets

(51) Int. Cl.
*G06K 7/10* (2006.01)
*B65D 75/32* (2006.01)

(52) U.S. Cl.
CPC ....... *H05K 13/046* (2013.01); *H05K 13/0417* (2013.01); *B65D 2585/86* (2013.01); *H05K 2203/0147* (2013.01)

(56) References Cited

U.S. PATENT DOCUMENTS

| | | | | |
|---|---|---|---|---|
| 4,620,678 A * | 11/1986 | Kumakura et al. | ........ | 242/332.3 |
| 4,810,154 A * | 3/1989 | Klemmer | ........... | H05K 13/0417 414/222.02 |
| 5,024,720 A * | 6/1991 | Boss | .................. | H05K 13/0417 156/702 |
| 6,077,022 A * | 6/2000 | Gfeller | ............... | H05K 13/0417 221/211 |
| 6,157,870 A * | 12/2000 | Gfeller | ............... | H05K 13/0417 221/73 |
| 6,202,728 B1 | 3/2001 | Takada et al. | | |
| 6,318,437 B1 * | 11/2001 | Yoo | ...................... | H05K 13/021 156/701 |
| 6,902,090 B2 * | 6/2005 | Yamamura | ......... | H05K 13/0417 226/133 |
| 6,918,730 B2 * | 7/2005 | Kawai et al. | ................. | 414/183 |
| 8,091,215 B2 * | 1/2012 | Tsukagoshi | ........ | H05K 13/0417 29/740 |
| 8,181,337 B2 * | 5/2012 | Watanabe | ............ | H05K 13/021 29/740 |
| 2002/0124391 A1 * | 9/2002 | Kawai | ................ | H05K 13/0417 29/739 |
| 2002/0184755 A1 * | 12/2002 | Suhara | ............... | H05K 13/0069 29/833 |
| 2003/0046808 A1 * | 3/2003 | Eskang | .............. | H05K 13/0417 29/650 |
| 2003/0051821 A1 * | 3/2003 | Bergstrom | ......... | H05K 13/0417 156/767 |
| 2003/0072644 A1 * | 4/2003 | Yamamura | ......... | H05K 13/0417 414/749.1 |
| 2003/0116934 A1 * | 6/2003 | Endo | .................... | H05K 13/021 280/47.35 |
| 2004/0039480 A1 * | 2/2004 | Kou | ...................... | H05K 13/021 700/222 |
| 2004/0188017 A1 * | 9/2004 | Davis | ................... | H05K 13/021 156/701 |
| 2005/0005435 A1 * | 1/2005 | Yanagida | ........... | H05K 13/0417 29/834 |
| 2006/0064192 A1 * | 3/2006 | Shimizu | ................. | H05K 13/08 700/121 |
| 2006/0102681 A1 * | 5/2006 | Ricketson | .......... | H05K 13/0417 226/128 |
| 2006/0111222 A1 * | 5/2006 | Yasui | ................. | H05K 13/0408 483/1 |
| 2007/0011869 A1 * | 1/2007 | Watanabe | ............ | H05K 13/021 29/739 |
| 2007/0135309 A1 * | 6/2007 | Swab | ................. | H05K 13/0417 505/212 |
| 2008/0103616 A1 * | 5/2008 | Wada | ................. | H05K 13/0417 700/95 |
| 2010/0239401 A1 * | 9/2010 | Kim | ..................... | B65H 37/002 414/412 |
| 2010/0290885 A1 * | 11/2010 | Kou | ...................... | B65H 26/02 414/751.1 |
| 2012/0055280 A1 * | 3/2012 | Taylor, IV | ......... | H05K 13/0417 74/522 |
| 2012/0285628 A1 * | 11/2012 | Katsumi | ............ | H05K 13/0417 156/767 |
| 2012/0305585 A1 * | 12/2012 | Nagao | ................ | H05K 13/0417 221/25 |
| 2014/0230241 A1 * | 8/2014 | Yamasaki et al. | .............. | 29/739 |
| 2014/0346212 A1 * | 11/2014 | Kawaguchi | ........ | H05K 13/0417 226/76 |
| 2015/0013152 A1 * | 1/2015 | Tada et al. | ....................... | 29/739 |
| 2015/0033555 A1 * | 2/2015 | Mizokami | .......... | H05K 13/0417 29/832 |
| 2015/0034714 A1 * | 2/2015 | Koyanagi | .......... | H05K 13/0417 235/375 |
| 2015/0047788 A1 * | 2/2015 | Kanda | ................ | H05K 13/0417 156/767 |
| 2015/0060478 A1 * | 3/2015 | Noda | ................. | H05K 13/0417 221/73 |
| 2015/0319892 A1 * | 11/2015 | Kawaguchi | ............ | B65H 20/20 226/83 |
| 2016/0021761 A1 * | 1/2016 | Iwata | ..................... | H05K 13/08 29/832 |
| 2016/0021803 A1 * | 1/2016 | Iwata | ..................... | H05K 13/08 703/6 |
| 2016/0048127 A1 * | 2/2016 | Sagara | ............. | G05B 19/41805 700/97 |

FOREIGN PATENT DOCUMENTS

| | | |
|---|---|---|
| JP | 2003-188591 A | 7/2003 |
| JP | 2010-040901 A | 2/2010 |
| JP | 2011-138834 A | 7/2011 |
| WO | 2011/077880 A1 | 6/2011 |

OTHER PUBLICATIONS

International Search Report issued Apr. 17, 2012 in PCT/JP2012/056400 filed Mar. 13, 2012.
International Search Report dated Nov. 9, 2015 in PCT/JP2012056400 filed Mar. 13, 2012.

* cited by examiner

FEEDER MANAGEMENT SYSTEM OF COMPONENT MOUNTING APPARATUS

TECHNICAL FIELD

The present invention relates to a feeder management system of a component mounting apparatus that supplies a component to the component mounting apparatus with a feeder configured such that a plurality of tape suppliers are individually and detachably mounted on a plurality of slots of a feeder body.

BACKGROUND ART

In a typical tape feeder of the related art, since one type of component is supplied by loading only one component supply tape on one tape feeder, it is necessary to increase the number of the tape feeders that are set to a feeder set stand of a component mounting apparatus to increase the number of types of component supplied to the component mounting apparatus. However, since the number of tape feeders that are capable of being set in the feeder set stand of the component mounting apparatus is limited by a lateral width dimension of the feeder set stand, the number of types of component capable of being supplied to the component mounting apparatus is also limited.

Thus, the applicant of the invention proposes a tape feeder that is configured such that a plurality of tape suppliers that guide a plurality of component supply tapes wound around a plurality of tape reels to a component pick-up position are individually and detachably mounted on a plurality of slots of a feeder body as described in PTL 1 (JP-A-2011-138834). The tape feeder is formed in which a mounting operation of the tape supplier can be performed with respect to the slot of a feeder body in a state where the tape feeder is set on a feeder set stand of the component mounting apparatus.

CITATION LIST

Patent Literature

PTL 1: JP-A-2011-138834

SUMMARY OF INVENTION

Technical Problem

As in the tape feeder disclosed in PTL 1, in the configuration in which the plurality of tape suppliers are individually and detachably mounted on the plurality of slots of the feeder body, it is necessary to confirm that the component that is specified in a job (production program) is supplied from a correct slot that is specified. Thus, a bar code label in which component identification information (component ID) that identifies the component stored in the component supply tape is recorded is adhered to a tape reel of the component supply tape, a supplier ID storage section in which identification information (supplier ID) of the tape supplier is stored is provided in the tape supplier, the component ID is associated with the supplier ID in advance and when mounting the tape supplier on one of the slots of the feeder body, the supplier ID is recognized, and the component ID is specified based on this. Therefore, it is considered whether or not the component specified in the job is supplied from the correct slot.

However, in the configuration, in order to confirm whether or not the component specified in the job is supplied from the correct slot, it is necessary to read two IDs (component ID and supplier ID) and there is a problem that it takes time. Furthermore, if a configuration is adopted in which the supplier ID is automatically read, an operator may read only the component ID, but in this configuration, it is necessary to provide an ID reading device that automatically reads the supplier ID separately from a bar code reader that reads the component ID and there is a problem that cost is increased.

Thus, an object of the invention is to provide a feeder management system of a component mounting apparatus in which an operation for confirming whether or not a specified component is supplied from a correct slot can be simplified and a demand for cost reduction can be satisfied.

Solution to Problem

In order to solve the above problem, the invention is a feeder management system of a component mounting apparatus that performs amounting operation of a tape supplier on a slot of a feeder body in a state where a tape feeder is set on a feeder set stand of the component mounting apparatus, including: a tape feeder that is configured such that a plurality of tape suppliers that guide a plurality of component supply tapes pulled out from a plurality of tape reels to a component pick-up position are individually and detachably mounted on a plurality of slots of the feeder body; a component identification information recording section which is provided in the tape reel of a component supply tape and in which component identification information identifying a component stored in the component supply tape is recorded or stored; an instruction display section that is provided respectively in the plurality of slots of the feeder body and that instructs displaying of which slot on which the tape supplier is to be mounted is instructed to an operator; component identification information reading means for reading the component identification information from the component identification information recording section of the tape reel; display switching means for allowing the instruction display section to display the instruction of the slot that is to be mounted among the plurality of slots based on the component identification information read by the component identification information reading means; mounting confirmation means for confirming on which slot the tape supplier is mounted in the instruction display of the instruction display section; and collating means for determining whether or not the component in which the component identification information is read in the component identification information reading means is supplied from a correct slot depending on whether or not the slot in which the mounting of the tape supplier is confirmed in the mounting confirmation means matches the slot that is displayed in the instruction in the instruction display section.

In this configuration, if the tape supplier is mounted on one of slots of the feeder body, first, the operator reads the component identification information from the component identification information recording section of the tape reel using the component identification information reading means. Therefore, since the instruction display section automatically performs the instruction display of the slot that is to be mounted among the plurality of slots based on the component identification information that is read, the operator may mount the tape supplier on the slot that is displayed in the instruction in the instruction display section and the mounting operation of the tape supplier is simply performed. If the slot in which the mounting of the tape supplier is confirmed in the mounting confirmation means matches the slot that is displayed in the instruction in the instruction display section, it is determined that the component in which the component identification information is read is supplied from the correct slot. On the other hand, if the slot in which the mounting of the tape supplier is confirmed does not match the slot that is displayed in the instruction in the instruction display section, it is determined that the tape supplier is mounted on an incorrect slot different from the instruction display. In this case, since it is not necessary to read the identification information of the tape supplier, it is possible to simplify a confirmation operation of whether or not the specified component is supplied from the correct slot and a demand for cost reduction can be satisfied.

In the invention, the instruction display of the instruction display section may be stopped and the operator may be instructed by display or voice to restart the mounting operation of the tape supplier from an operation for reading the component identification information in the component identification information reading means when the mounting of the tape supplier is not confirmed by the mounting confirmation means before a predetermined period of time has elapsed from start of the instruction display of the instruction display section. When the mounting of the tape supplier on the slot is not performed even when a predetermined period of time has elapsed from the start of the instruction display of the instruction display section, it is considered that the mounting of the tape supplier that supplies the component in which the operator reads the component identification information has ceased. Thus, in this case, the instruction display of the instruction display section is stopped and the instruction to the operator is performed by display or voice to restart the mounting operation of the tape supplier from an operation for reading the component identification information in the component identification information reading means. Therefore, it is possible to prevent beforehand that the tape supplier supplying a component different from the component on which the component identification information is read is erroneously mounted on the slot that is displayed in the instruction by the instruction display section.

Furthermore, it is determined that the tape supplier is mounted on an incorrect slot and the operator may be instructed by display or voice to restart the mounting operation of the tape supplier when the slot in which the mounting of the tape supplier is confirmed by the mounting confirmation means does not match the slot that is displayed in the instruction in the instruction display section. Therefore, it is possible to reliably prevent human error in the mounting operation of the tape supplier.

Furthermore, as described in claim 4, the instruction display section may display the instruction by disposing one or a plurality of light emitting elements in each slot and by lighting or blinking the light emitting element of the slot on which the tape supplier is to be mounted. Therefore, it is possible to make the instruction display section that is easily read by the operator and is configured at low cost.

DESCRIPTION OF EMBODIMENTS

Figure 1:
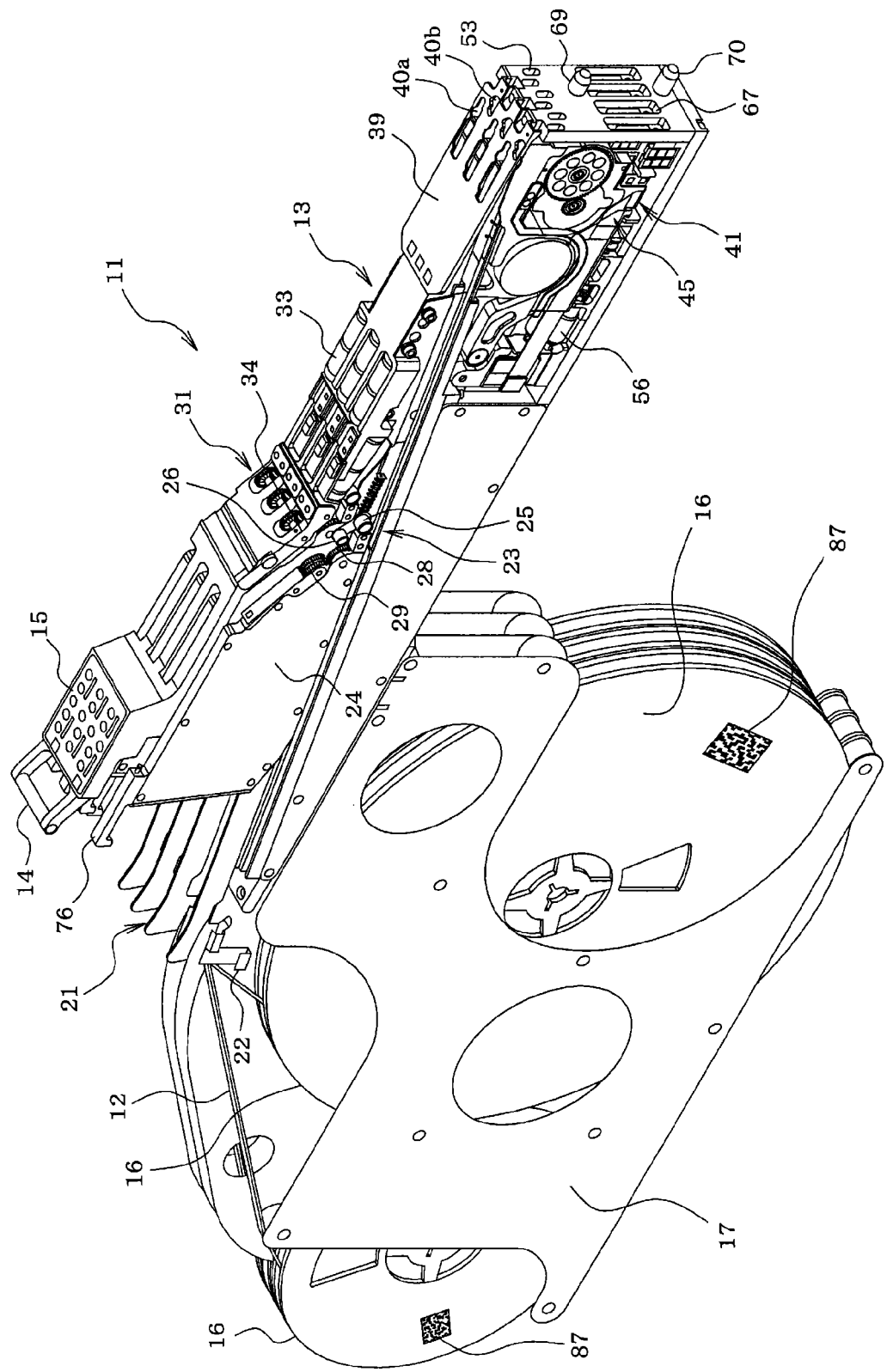
FIG. 1 is a perspective view of an entire tape feeder in an embodiment of the invention.
Figure 2:
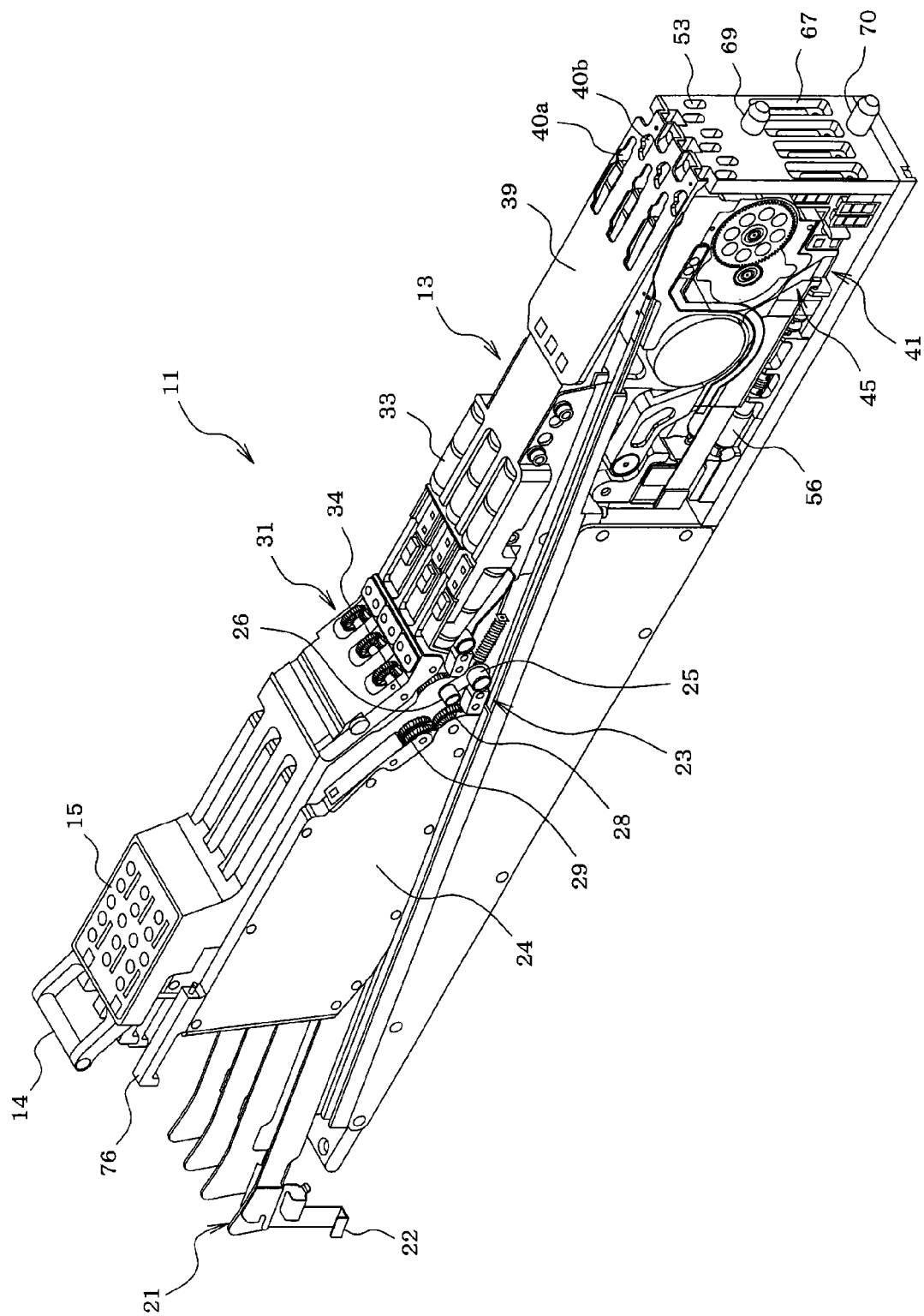
FIG. 2 is a perspective view (part 1) of a feeder body.

Hereinafter, one embodiment embodying an aspect for carrying out the invention will be described with reference to the drawings.

First, a configuration of a tape feeder 11 is described.

In the tape feeder 11, in order to set a plurality of component supply tapes 12 in parallel in a lateral width direction, a lateral width of a feeder body 13 is formed as approximately multiple of a lateral width of a typical tape feeder (tape feeder capable of setting only one component supply tape) of the related art. In the embodiment, the lateral width of the feeder body 13 is, for example, substantially four times (substantially M times) the typical tape feeder of the related art due to reducing a gap between adjacent component supply tapes 12 and then six (N, where N is an integer greater than M) component supply tapes 12 can be set in parallel in the lateral width direction. Detailed description is not illustrated, but the component supply tape 12 is configured such that components are stored in component storage concave sections that are formed in a row at a predetermined pitch in a carrier tape and a top tape (also referred to as cover tape) is adhered to an upper surface of the carrier tape. Sprocket holes (not illustrated) are formed in a row at a predetermined pitch along a side edge of the component supply tape 12.

A handle section 14 and an operation panel 15 are provided in an upper portion of the feeder body 13 on a rear portion side (removing direction side) and a reel holder 17 storing a tape reel 16 around which the component supply tape 12 is wound is provided on a lower side thereof. The reel holder 17 is formed so as to store a plurality of tape reels 16 in parallel in two rows in front and at the back. Each tape reel 16 is stored so as to rotate inside the reel holder 17 as the component supply tape 12 is pulled out. Operation keys and the like that input various operation signals such as a tape supplier mounting start signal are provided for each sprocket drive unit 41 (for each tape supplier 21) in the operation panel 15.

The component supply tape 12 pulled out from each tape reel 16 is guided to a component pick-up position by the tape supplier 21. The lateral width of each tape supplier 21 is formed to be slightly greater than that of the component supply tape 12 so as to set only one component supply tape 12 in each tape supplier 21.

The feeder body 13 is provided with a plurality of slots 84 (see FIG. 10) for mounting a plurality of tape suppliers 21 and is configured such that the tape supplier 21 is detachably mounted on each slot 84 one by one.

Figure 4:
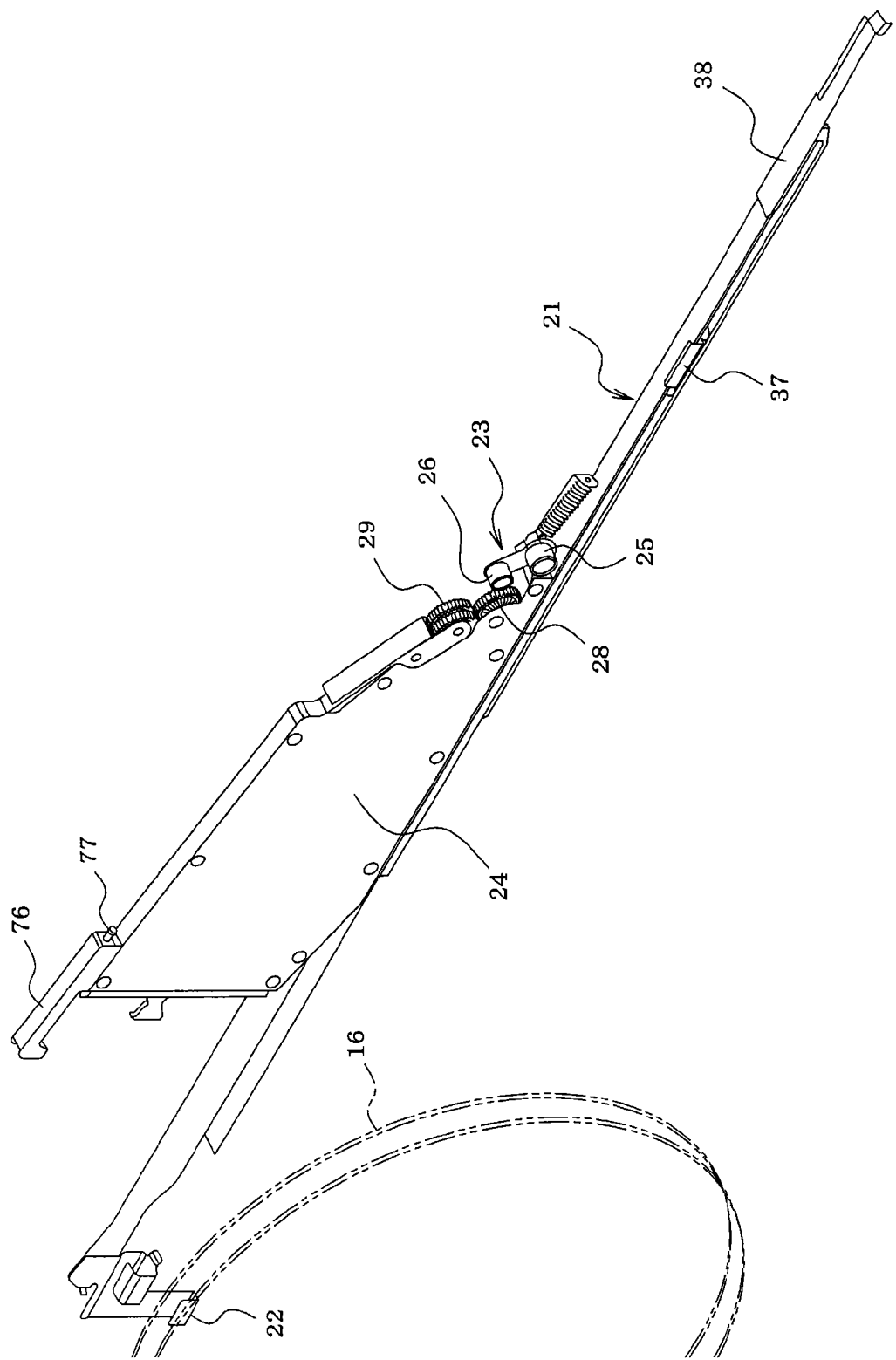
FIG. 4 is a perspective view of a tape supplier.

As illustrated in FIG. 4, a reel engaging section 22 for holding the tape reel 16 in the tape supplier 21 removed from the feeder body 13 is provided in a rear end portion of each tape supplier 21. The tape reel 16 can be engaged and held in the reel engaging section 22.

The tape supplier 21 is provided with a cover tape peeling device 23 that peels the cover tape covering the upper surface of the component supply tape 12 and a cover tape recovery case 24 that recovers the cover tape that is peeled from the component supply tape 12. The cover tape peeling device 23 includes a peeling roller 25, a tension roller 26, and a pair of cover tape feeding gears 28 and 29. The cover tape that is peeled by the peeling roller 25 is passed over the tension roller 26 and is sandwiched between the cover tape feeding gears 28 and 29, and then is fed into the cover tape recovery case 24.

Figure 5:
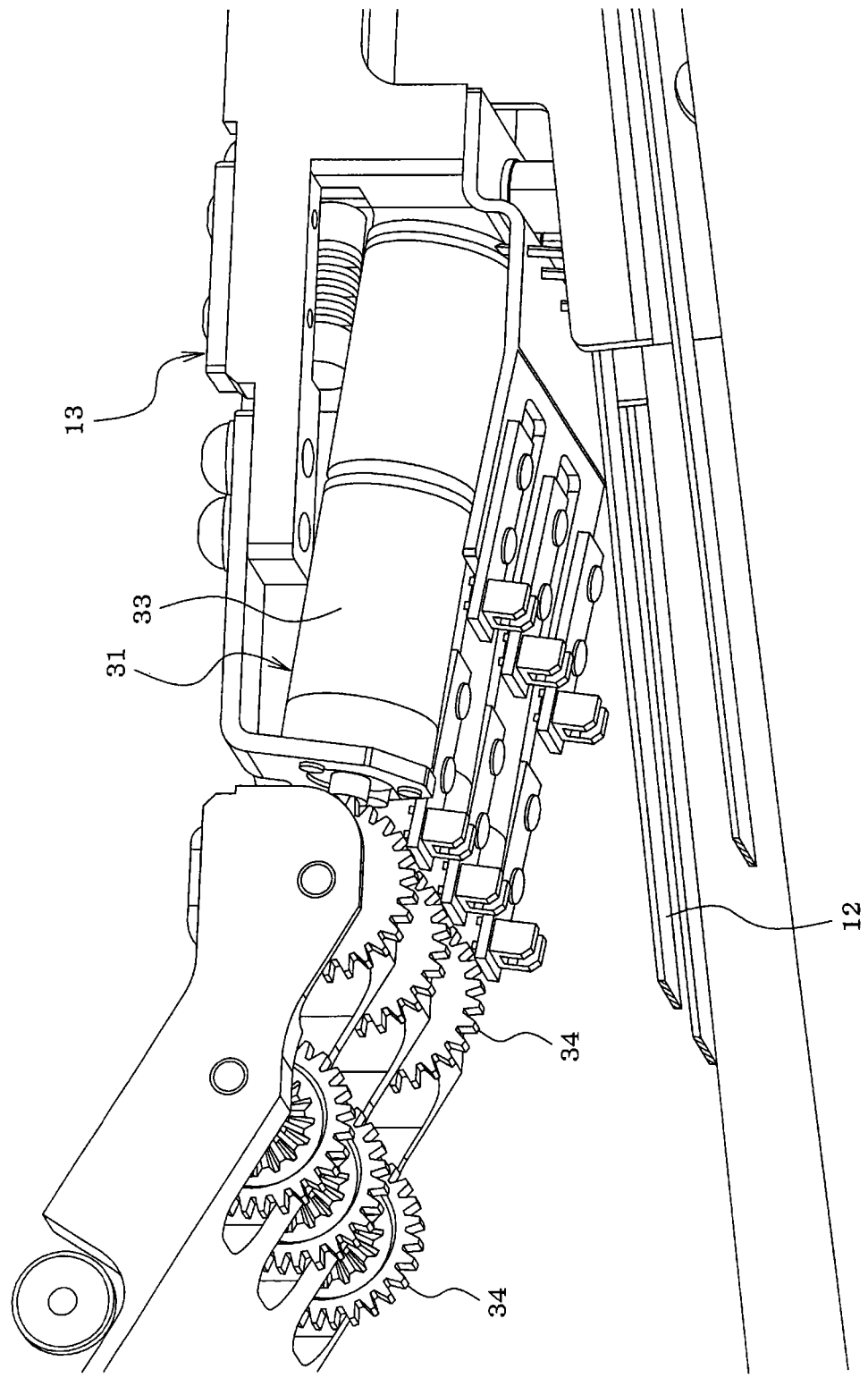
FIG. 5 is a perspective view (part 1) illustrating a drive device of a cover tape feeding gear and a peripheral portion thereof.

A drive source of the cover tape feeding gears 28 and 29 is provided on the side of the feeder body 13. When mounting the tape supplier 21 on the feeder body 13, one cover tape feeding gear 28 meshes with a drive gear 34 (see FIG. 5) of the feeder body 13 and then both cover tape feeding gears 28 and 29 are driven to be rotated.

Figure 6:
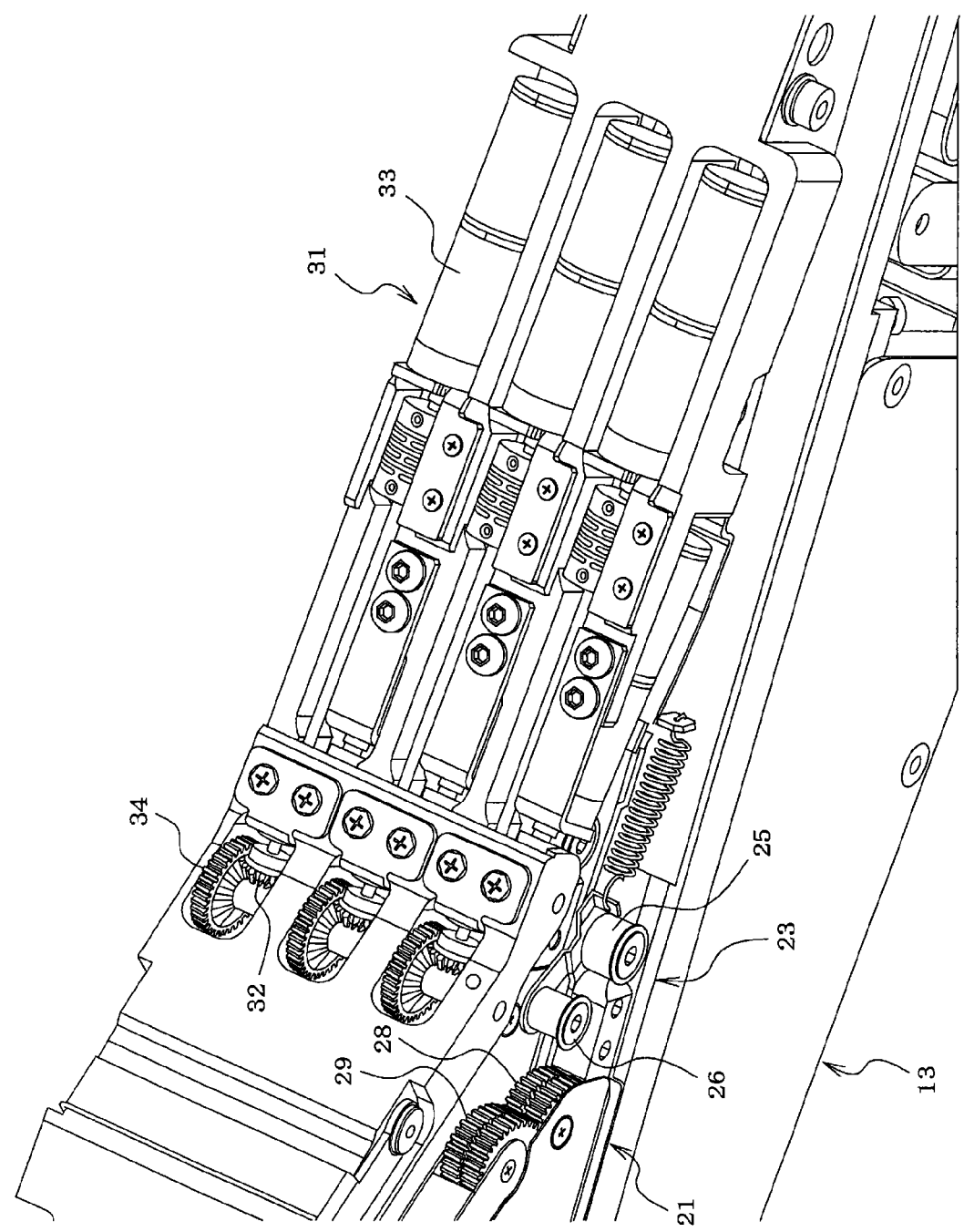
FIG. 6 is a perspective view (part 2) illustrating a drive device of a cover tape feeding gear and a peripheral portion thereof.

A drive device 31 for driving the cover tape feeding gears 28 and 29 is provided on an upper side of a mounting space of the tape supplier 21 in the feeder body 13. The drive device 31 includes a motor 33 that rotates a bevel gear 32 (see FIG. 6) and the drive gear 34 that is driven to be rotated by the bevel gear 32. The drive gear 34 meshes with one cover tape feeding gear 28 and then both cover tape feeding gears 28 and 29 are driven to be rotated. Each of the motor 33, the bevel gear 32, and the drive gear 34 is provided having the same number as the number of the tape suppliers 21 capable of being mounted on the feeder body 13. A feeding amount (peeling amount) of the cover tape can be independently controlled for each tape supplier 21.

As illustrated in FIG. 4 a plurality of laterally U-shaped tape holding sections 37 and 38 that hold only one side of the component supply tape 12 in the width direction are disposed in the tape supplier 21 such that the tape holding sections 37 and 38 are disposed in a staggered manner alternately on one side and the other side of the component supply tape 12 in the width direction. Each of the tape holding sections 37 and 38 is disposed by being biased slightly inside the component supply tape 12 in the width direction so that the component supply tape 12 is held while the component supply tape 12 is meandered (or tilted) slightly in the width direction. Therefore, it is possible to hold the component supply tape 12 with a less width.

Figure 3:
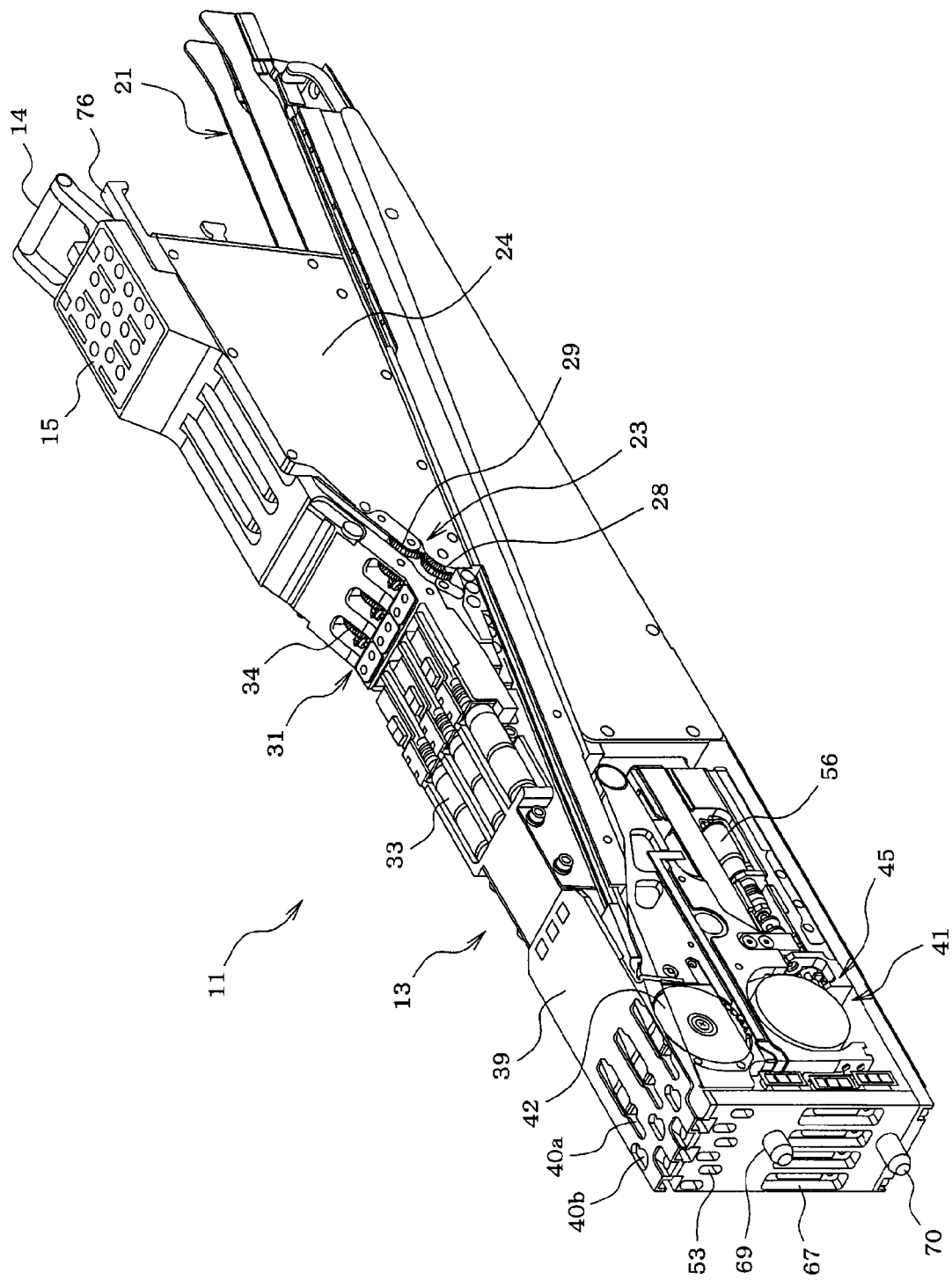
FIG. 3 is a perspective view (part 2) of a feeder body.

The sprocket drive units 41 having the same number as the number of the component supply tapes 12 capable of being set in the feeder body 13 are assembled on the side of a leading end portion of the feeder body 13 in parallel in the width direction. A sprocket 42 (see FIG. 3) is driven to be rotated by each sprocket drive unit 41 and then the component supply tape 12 is fed by the pitch.

Each sprocket drive unit 41 is configured so as to vertically move a sprocket drive mechanism section 45 that drives the sprocket 42 between a meshed position in which teeth of the sprocket 42 mesh with sprocket holes of the component supply tape 12 and a retracted position in which the teeth of the sprocket 42 are positioned further below the component supply tape 12 than the sprocket holes. The sprocket drive mechanism section 45 is biased upward by a spring (not illustrated) and then the sprocket 42 is held in the meshed position. A motor 56 is provided for lowering the sprocket drive mechanism section 45 against the spring when attaching and detaching the tape supplier 21 to and from the tape feeder 11. In the configuration, when attaching and detaching the tape supplier 21 to and from the tape feeder 11, the motor 56 for vertically moving the sprocket drive mechanism section is operated. If the sprocket drive mechanism section 45 is in a state of being lowered to the retracted position against a spring 55, the teeth of the sprocket 42 are positioned further below the component supply tape 12 than the sprocket holes of the component supply tape 12. Thus, the operation for attaching and detaching the tape supplier 21 to and from the tape feeder 11 can be performed. In addition, after the tape supplier 21 is set in the tape feeder 11, when rotating (or releasing a drive force of the motor 56) the motor 56 for vertically moving the sprocket drive mechanism section to the original position, the sprocket drive mechanism section 45 is raised to the meshed position by the spring and thereby the teeth of the sprocket 42 can be automatically meshed with the sprocket holes of the component supply tape 12. Therefore, it is possible to simplify the operation for attaching and detaching the tape supplier 21 to and from the tape feeder 11.

Component pick-up opening sections 40a and 40b are formed in a staggered manner in an upper surface cover plate 39 that covers an upper side of the sprocket drive unit 41 in the feeder body 13. The component pick-up opening sections 40a and 40b open the component pick-up position in order to pick up the component of the component supply tape 12 by a pick-up nozzle of the component mounting apparatus. In the embodiment, since a total of six component supply tapes 12 are capable of being loaded on the feeder body 13, a total of six component pick-up opening sections 40a and 40b are formed.

Figure 7:
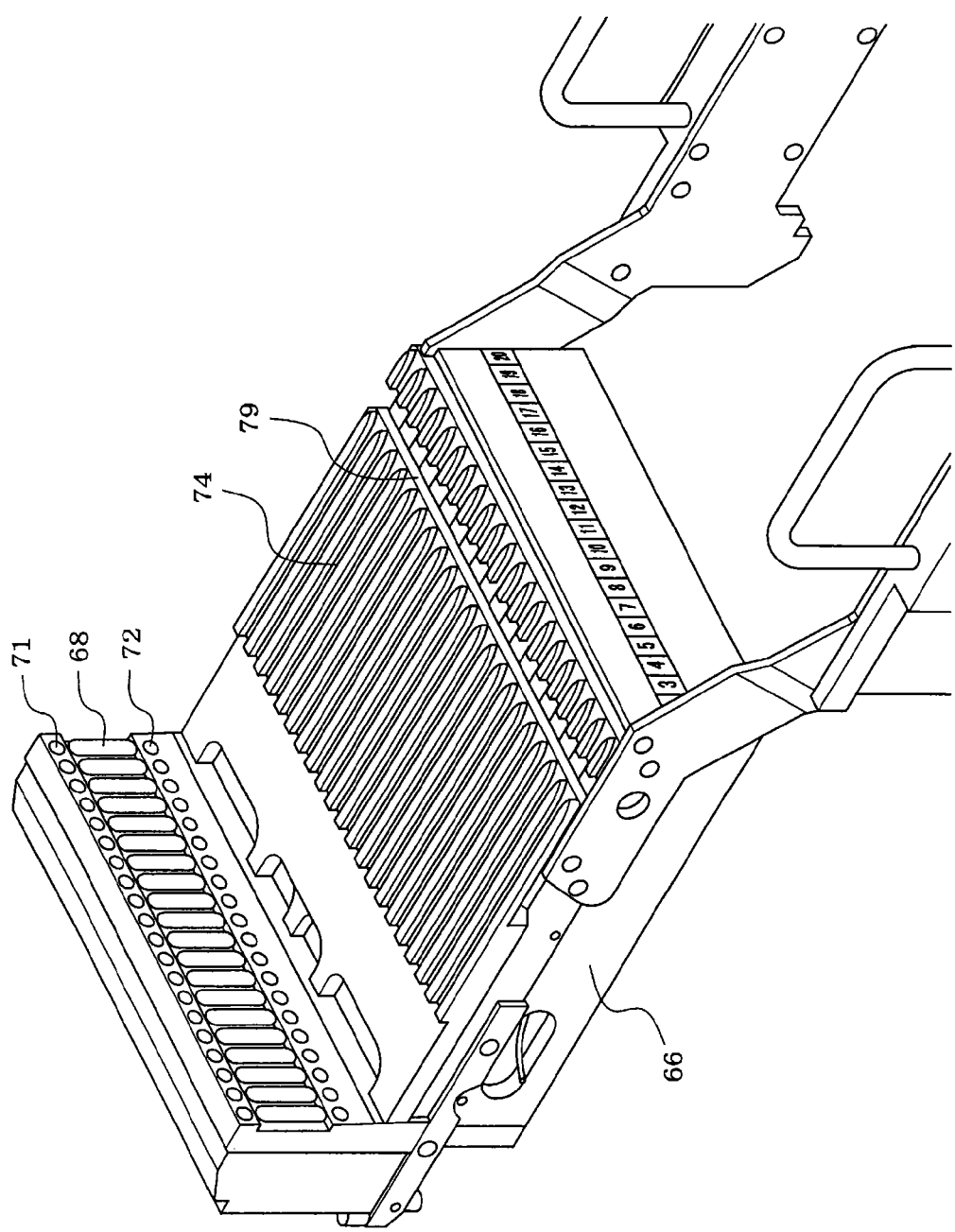
FIG. 7 is a perspective view of a feeder set stand of a component mounting apparatus.

A connector 67 and two positioning pins 69 and 70 are provided in a leading end surface of the feeder body 13. The connector 67 is provided to connect a signal line or a power supply line of the feeder body 13 to a connector 68 (see FIG. 7) of a feeder set stand 66 of the component mounting apparatus. A mounting position of the feeder body 13 on the feeder set stand 66 is determined and the connector 67 of the feeder body 13 is inserted and connected to the connector 68 of the feeder set stand 66 by inserting the two positioning pins 69 and 70 into positioning holes 71 and 72 (see FIG. 7) of the feeder set stand 66 of the component mounting apparatus.

A guide groove 74 having a cross section of a reversed T shape for supporting the upright tape feeder 11 is provided on an upper surface of the feeder set stand 66. The tape feeder 11 is supported on the feeder set stand 66 in an upright state by inserting a guide rail (not illustrated) having a cross section of a reversed T shape provided on the side of a lower surface of the feeder body 13 into the guide groove 74 from the front side. In addition, a clamp member (not illustrated) provided in the feeder body 13 is fitted into a clamp groove 79 of the feeder set stand 66 and then the feeder body 13 is clamped by pressing the feeder body 13 to the front side (the side of the connector 68 of the feeder set stand 66). Therefore, the feeder body 13 is positioned on the feeder set stand 66 in a front and rear direction and then is detachably mounted on the feeder set stand 66.

Each handle section 76 is provided in an upper end rear portion of the cover tape recovery case 24 of each tape supplier 21 and a positioning pin 77 (see FIG. 9) is provided in a front end portion of each handle section 76. Correspondingly thereto, a positioning hole 78 (see FIG. 8) is formed in a lower stepped portion of the operation panel 15 of the feeder body 13. When setting the tape supplier 21 in the feeder body 13, the positioning pin 77 of the handle section 76 is inserted into the positioning hole 78 of the operation panel 15 on the lower side. Therefore, the handle section 76 is positioned on the lower surface of the operation panel 15. In the embodiment, in a state where the tape feeder 11 is set in the feeder set stand 66 of the component mounting apparatus, it is possible to perform the operation of mounting of the tape supplier 21 with respect to the slot 84 of the feeder body 13.

Figure 8:
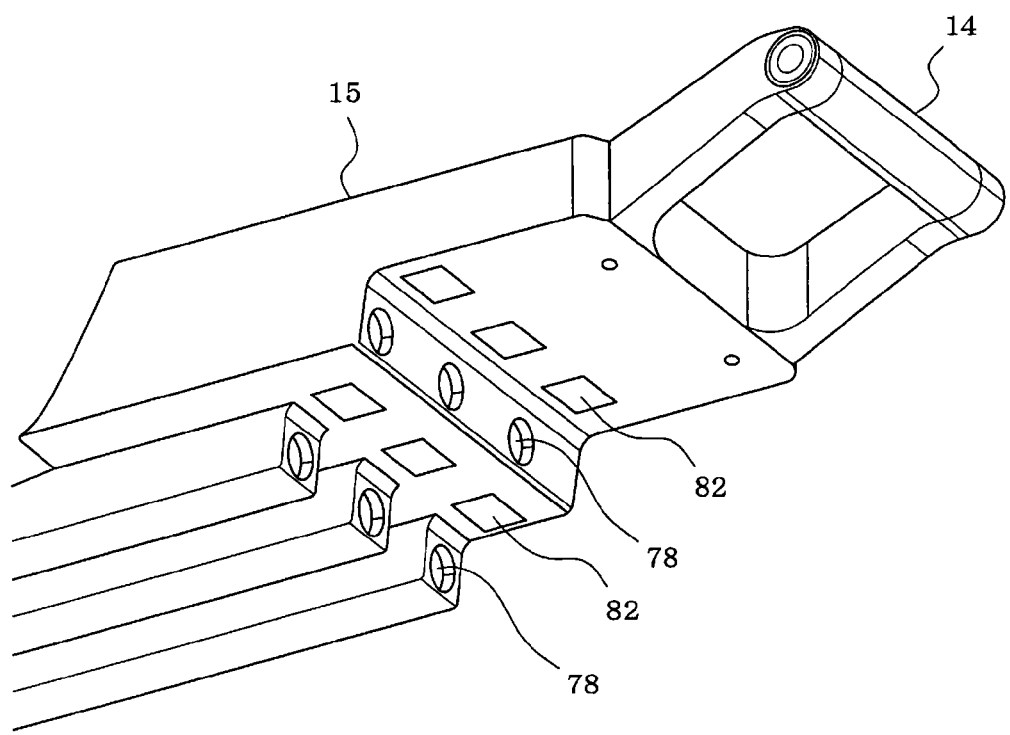
FIG. 8 is a perspective view illustrating a configuration of an operation panel of the feeder body on a lower surface side.
Figure 9:
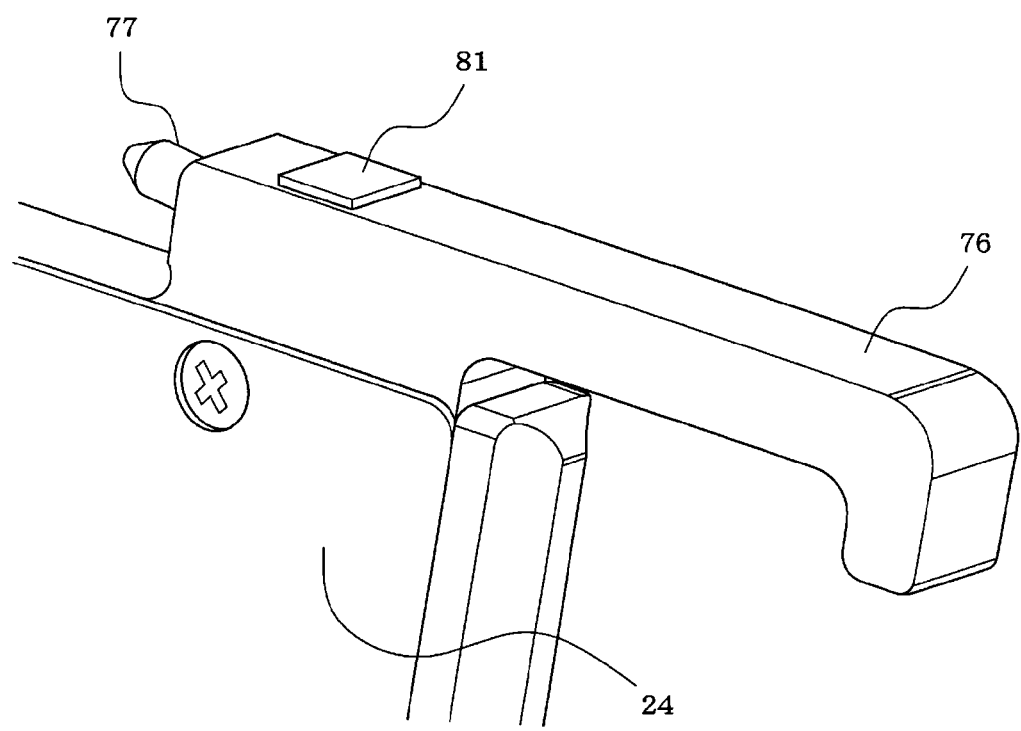
FIG. 9 is an enlarged perspective view of a handle section of the tape supplier and a peripheral portion thereof.

As illustrated in FIG. 8, a mounting confirmation sensor 82 (mounting confirmation means) such as a proximity sensor for confirming the mounting of the tape supplier 21 is provided on the lower surface of the operation panel 15 of the feeder body 13 for each slot 84. The tape supplier 21 is set in any one of the slots 84 of the feeder body 13 and thereby the positioning pin 77 of the handle section 76 is in a state of being inserted into the positioning hole 78 of the operation panel 15 on the lower side. Thus, a detected section 81 on the upper surface of the handle section 76 approaches and corresponds to the mounting confirmation sensor 82 on the lower surface of the operation panel 15 and thereby the detected section 81 is detected by the mounting confirmation sensor 82. Therefore, the mounting of the tape supplier 21 on the slot 84 is confirmed.

Figure 10:
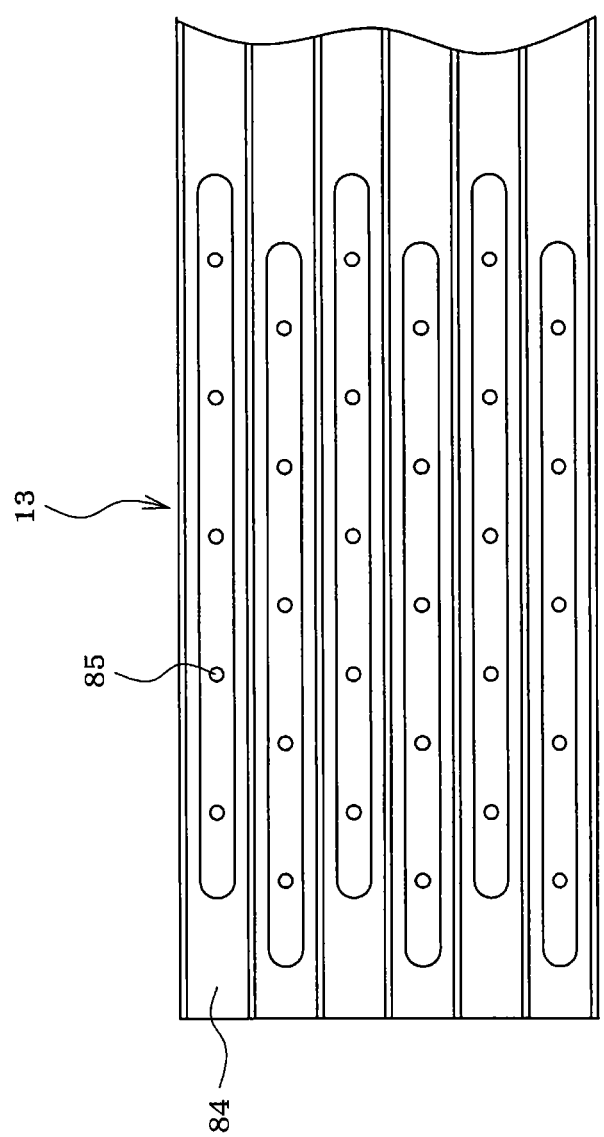
FIG. 10 is a view illustrating arrangement of slots of the feeder body.

As illustrated in FIG. 10, an instruction display section 85 that instructs displaying of which slot 84 on which the tape supplier 21 is to be mounted is instructed to the operator is provided in the plurality of slots 84 of the feeder body 13 at a position that is viewed by the operator. The instruction display section 85 of each slot 84 is configured by arranging light emitting elements such as a plurality of LEDs in one row.

On the other hand, as illustrated in FIG. 1, a component ID code label 87 (component identification information recording section) in which the component ID (component identification information) that identifies the component stored in the component supply tape 12 wound around the tape reel 16 is recorded by printing and the like is provided in the tape reel 16 by adhesive and the like. The component ID recorded in the component ID code label 87 is represented by a one-dimensional code or a two-dimensional code. The feeder management system (see FIG. 11) of the embodiment is provided with a code reader 88 (component identification information reading means) that reads the component ID from the component ID code label 87 of the tape reel 16.

Figure 11:
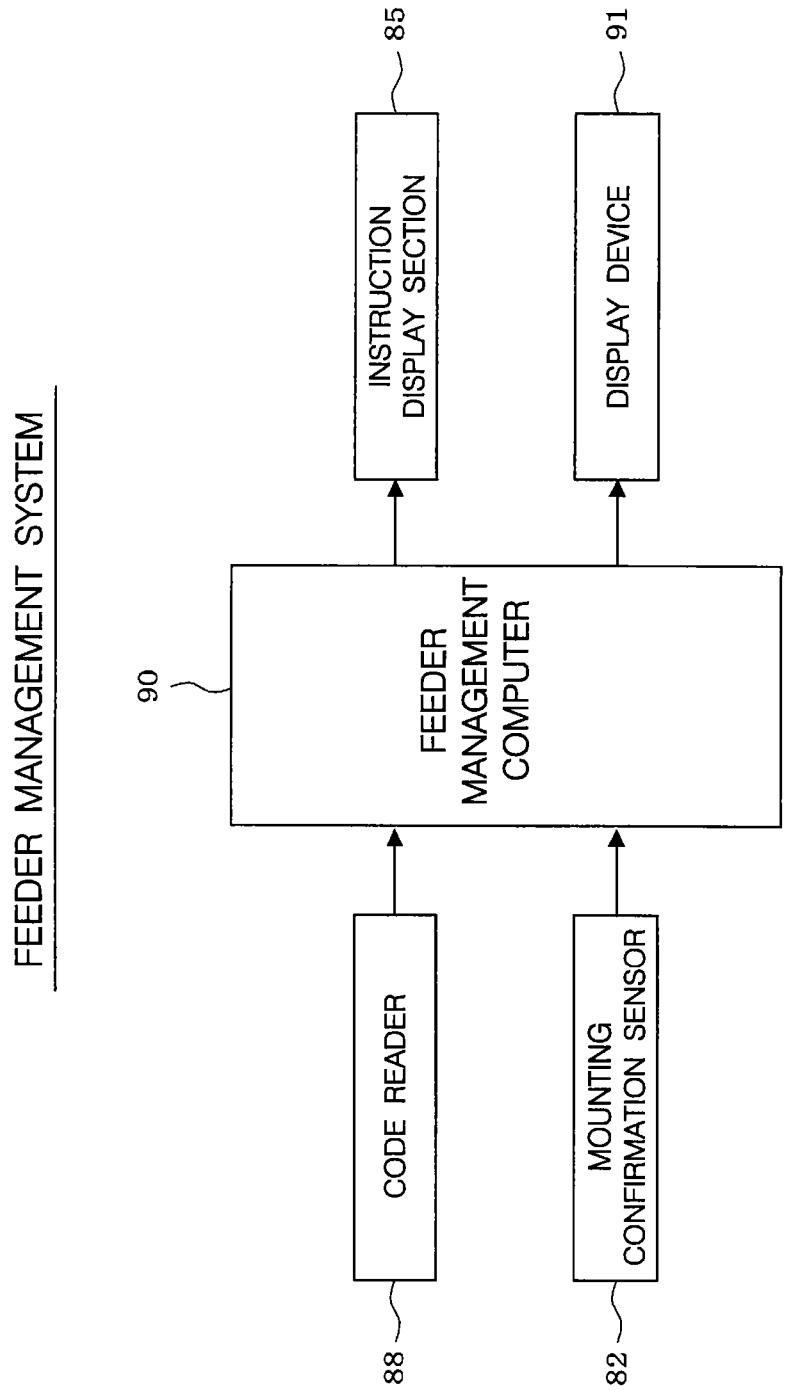
FIG. 11 is a block diagram schematically illustrating a configuration of a feeder management system.

As illustrated in FIG. 11, the component ID that is read by the code reader 88 is transmitted to a feeder management computer 90. The feeder management computer 90 is configured of a host computer that manages production in a component mounting line including a plurality of component mounting apparatuses and/or a control computer of each component mounting apparatus. The feeder management computer 90 functions as display switching means for allowing the instruction display section 85 to display the instruction of the slot 84 that is to be mounted among the plurality of slots 84 of the feeder body 13 by lighting or blinking the instruction display section 85, based on the component ID read by the code reader 88, and functions as collating means for determining whether or not the component in which the component ID is read in the code reader 88 is supplied from the correct slot 84 depending on whether or not the slot 84 in which the mounting of the tape supplier 21 is confirmed in the mounting confirmation sensor 82 matches the slot 84 that is displayed in the instruction in the instruction display section 85.

In this configuration, if the tape supplier 21 is mounted on one of the slots 84 of the feeder body 13, first, the operator reads the component ID from the component ID code label 87 of the tape reel 16 using the code reader 88. Then, the component ID read by the code reader 88 is transmitted to the feeder management computer 90. Therefore, in the feeder management computer 90, the instruction display is performed by lighting or blinking the instruction display section 85 of the slot 84 that is to be mounted among the plurality of slots 84 of the feeder body 13 based on the component ID that is read by the code reader 88. Furthermore, if the component of the component ID that is read by the code reader 88 is a component that is not used in the job (production program), it is determined that the operator has selected an incorrect tape supplier 21 and then instruction to the operator may be performed by display or voice of a display device 91 to restart from the reading operation of the component ID by the code reader 88.

If it is confirmed that the tape supplier 21 is mounted on one of the slots 84 by the mounting confirmation sensor 82 in the instruction display of the instruction display section 85, the feeder management computer 90 determines whether or not the slot 84 on which the mounting of the tape supplier 21 is confirmed by the mounting confirmation sensor 82 matches the slot 84 that is displayed in the instruction by the instruction display section 85. As a result, if the slot 84 on which the mounting of the tape supplier 21 is confirmed by the mounting confirmation sensor 82 matches the slot 84 that is displayed in the instruction by the instruction display section 85, it is determined that the component in which the component ID is read by the code reader 88 is supplied from the correct slot 84.

On the other hand, if the slot 84 on which the mounting of the tape supplier 21 is confirmed does not match the slot 84 that is displayed in the instruction by the instruction display section 85, it is determined that the tape supplier 21 is mounted on the incorrect slot 84 different from the instruction display of an instruction display section 85 and then the instruction to the operator is performed by display or voice of the display device 91 to restart the mounting operation of the tape supplier 21. Therefore, it is possible to reliably prevent human error in the mounting operation of the tape supplier 21.

Furthermore, the instruction display of the instruction display section 85 is stopped and the operator is instructed by display or voice of the display device 91 to restart the mounting operation of the tape supplier 21 from an operation for reading the component ID in the code reader 88 when the mounting of the tape supplier 21 is not confirmed by the mounting confirmation sensor 82 before a predetermined period of time has elapsed from start of the instruction display of the instruction display section 85. When the mounting of the tape supplier 21 on the slot 84 has not been performed even when a predetermined period of time has elapsed from the start of the instruction display of the instruction display section 85, it is considered that the mounting of the tape supplier 21 that supplies the component in which the operator reads the component ID has ceased. Thus, in this case, the instruction display of the instruction display section 85 is stopped and the instruction to the operator is performed by display or voice of the display device 91 to restart the mounting operation of the tape supplier 21 from the operation for reading the component ID in the code reader 88. Therefore, it is possible to prevent beforehand that the tape supplier 21 supplying a component different from the component on which the component ID is read is erroneously mounted on the slot 84 that is displayed in the instruction by the instruction display section 85.

In the embodiment described above, if the tape supplier 21 is mounted on one of the slots 84 of the feeder body 13, the operator may read the component ID from the component ID code label 87 of the tape reel 16 using the code reader 88 and since it is not necessary to read the identification information (ID) of the tape supplier 21, it is possible to simplify a confirmation operation of whether or not the specified component is supplied from the correct slot 84 and a demand for cost reduction can be satisfied.

In the embodiment, the component ID code label 87 in which the component ID represented by the one-dimensional code or the two-dimensional code is recorded by print and the like is used as the component identification information recording section, but a RF tag (also referred to as an electronic tag, an IC tag, a radio tag, and a wireless tag) in which data of the component ID is electronically written may be used as the component identification information recording section.

Furthermore, in the embodiment, as the mounting confirmation means that confirms the mounting of the tape supplier 21 to the slot 84 of the feeder body 13, the mounting confirmation sensor 82 such as the proximity sensor is used, but in a case of a configuration in which communication or power supply is performed between the tape supplier 21 and the feeder body 13, the mounting of the tape supplier 21 may be confirmed by a signal of the communication or the power supply immediately after the mounting of the tape supplier 21.

Furthermore, in the embodiment, the reel holder 17 that collectively stores the plurality of tape reels 16 is provided in the feeder body 13, but a configuration may be used in which reel holders respectively storing one tape reel 16 are provided in each tape supplier 21.

In addition, for example, in the invention, the instruction display section 85 of each slot 84 may be configured of one light emitting element or the number (the number of the slot 84) of the tape supplier 21 that is capable of being mounted on the feeder body 13 may be changed, and then, of course, various modifications may be implemented without departing from the gist thereof.

REFERENCE SIGNS LIST

11 . . . tape feeder, 12 . . . component supply tape, 13 . . . feeder body, 14 . . . handle section, 15 . . . operation panel, 16 . . . tape reel, 17 . . . reel holder, 21 . . . tape supplier, 22 . . . reel engaging section, 23 . . . cover tape peeling device, 24 . . . cover tape recovery case, 25 . . . peeling roller, 28 and 29 . . . cover tape feeding gear, 31 . . . drive device, 33 . . . motor, 34 . . . drive gear, 37 and 38 . . . tape holding section, 41 . . . sprocket drive unit, 42 . . . sprocket, 66 . . . feeder set stand, 67 and 68 . . . connector, 69 and 70 . . . positioning pin, 71 and 72 . . . positioning hole, 74 . . . guide groove, 76 . . . handle section, 77 . . . positioning pin, 78 . . . positioning hole, 81 . . . detected section, 82 . . . mounting confirmation sensor (mounting confirmation means), 84 . . . slot, 85 . . . instruction display section, 87 . . . component ID code label (component identification information recording section), 88 . . . code reader (component identification information reading means), 90 . . . feeder management computer (display switching means, collating means)

The invention claimed is:

1. A feeder management system of a component mounting apparatus that performs a mounting operation of a tape supplier on a slot of a feeder body including a plurality of slots in a state where a tape feeder is set on a feeder set stand of the component mounting apparatus, comprising:

a tape feeder that is configured such that a plurality of tape suppliers that guide a plurality of component supply tapes pulled out from a plurality of tape reels to a component pick-up position are individually and detachably mounted on the plurality of slots of the feeder body, each of the plurality of tape suppliers including a handle section, the handle section including a position pin on a front end portion of the handle section that is configured to be inserted in a position hole of the feeder body when mounted and the handle section including a detected section on a upper surface of the handle section;

a component identification information recording section which is provided in the tape reel and in which component identification information identifying a component stored in the component supply tape wound around the tape reel is recorded or stored;

an instruction display section that is provided respectively in the plurality of slots of the feeder body and that instructs displaying of which slot on which the tape supplier is to be mounted is instructed to an operator;

component identification information reading means for reading the component identification information from the component identification information recording section of the tape reel;

display switching means for allowing the instruction display section to display the instruction of the slot that is to be mounted among the plurality of slots based on the component identification information read by the component identification information reading means;

mounting confirmation means for confirming on which slot the tape supplier is mounted in the instruction display section by detecting the detected section when the positioning pin is inserted into the positioning hole; and collating means for determining whether or not the component in which the component identification information is read in the component identification information reading means is supplied from a correct slot by comparing the slot confirmed by the mounting confirmation means to the slot displayed by the instruction display section.

2. The feeder management system of a component mounting apparatus according to claim 1, wherein the collating means stops the instruction display of the instruction display section and the operator is instructed by display or voice to restart the mounting operation of the tape supplier from an operation for reading the component identification information in the component identification information reading means when the mounting of the tape supplier is not confirmed by the mounting confirmation means before a predetermined period of time has elapsed from start of the instruction display of the instruction display section.

3. The feeder management system of a component mounting apparatus according to claim 1, wherein the collating means determines that the tape supplier is mounted on an incorrect slot and the operator is instructed by display or voice to restart the mounting operation of the tape supplier when the slot in which the mounting of the tape supplier is confirmed by the mounting confirmation means does not match the slot that is displayed of the instruction in the instruction display section.

4. The feeder management system of a component mounting apparatus according to claim 1, wherein the instruction display section displays the instruction by disposing one or a plurality of light emitting elements in each slot and by lighting or blinking the light emitting element of the slot on which the tape supplier is to be mounted.

5. The feeder management system of a component mounting apparatus according to claim 2, wherein the collating means determines that the tape supplier is mounted on an incorrect slot and the operator is instructed by display or voice to restart the mounting operation of the tape supplier when the slot in which the mounting of the tape supplier is confirmed by the mounting confirmation means does not match the slot that is displayed of the instruction in the instruction display section.

6. The feeder management system of a component mounting apparatus according to claim 2, wherein the instruction display section displays the instruction by disposing one or a plurality of light emitting elements in each slot and by lighting or blinking the light emitting element of the slot on which the tape supplier is to be mounted.

7. The feeder management system of a component mounting apparatus according to claim 3, wherein the instruction display section displays the instruction by disposing one or a plurality of light emitting elements in each slot and by lighting or blinking the light emitting element of the slot on which the tape supplier is to be mounted.

8. The feeder management system of a component mounting apparatus according to claim 5, wherein the instruction display section displays the instruction by disposing one or a plurality of light emitting elements in each slot and by lighting or blinking the light emitting element of the slot on which the tape supplier is to be mounted.

9. A feeder management system of a component mounting apparatus that performs a mounting operation of a tape supplier on a slot of a feeder body in a state where a tape feeder is set on a feeder set stand of the component mounting apparatus, comprising:
   a tape feeder including a plurality of tape suppliers that guide a plurality of component supply tapes pulled out from a plurality of tape reels to a component pick-up position, the tape suppliers being individually and detachably mounted on a plurality of slots of the feeder body, each of the plurality of tape suppliers including a handle section, the handle section including a position pin on a front end portion of the handle section that is configured to be inserted in a position hole of the feeder body when mounted and the handle section including a detected section on a upper surface of the handle section;
   a label on a tape real of the plurality of tape reals, the label including component identification information that identifies a component stored in the component supply tape wound around the tape reel;
   an instruction display section that is provided respectively in the plurality of slots of the feeder body and that instructs displaying of which slot on which the tape supplier is to be mounted; and
   circuitry configured to:
      read the component identification information from the label;
      control the instruction display section to display an instruction of a slot that is to be mounted among the plurality of slots based on the component identification information;
      confirm which slot of the plurality of slots the tape supplier is mounted in the instruction display of the instruction display section by detecting the detected section when the positioning pin is inserted into the positioning hole; and
      determine whether the component in which the component identification information is read is supplied from a correct slot by comparing the slot confirmed to the slot displayed by the instruction display section.

10. The feeder management system of a component mounting apparatus according to claim 9, wherein the instruction display section displays the instruction by disposing one or a plurality of light emitting elements in each slot and by lighting or blinking the light emitting element in the slot on which the tape supplier is to be mounted.

11. The feeder management system of a component mounting apparatus according to claim 9, wherein the circuitry confirms which slot of the plurality of slots the tape supplier is mounted in the instruction display of the instruction display section using a proximity sensor that detects the detected section.

12. The feeder management system of a component mounting apparatus according to claim 1, wherein the mounting confirmation means includes a proximity sensor on the feeder body at each of the plurality of slots that detects the detected section.

* * * * *